United States Patent
Watarai (10) Patent No.: US 6,771,114 B2
(45) Date of Patent: Aug. 3, 2004

(54) CHARGE PUMP CURRENT COMPENSATING CIRCUIT

(75) Inventor: Seiichi Watarai, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 12 days.

(21) Appl. No.: 10/237,946

(22) Filed: Sep. 9, 2002

(65) Prior Publication Data

US 2003/0048126 A1 Mar. 13, 2003

(30) Foreign Application Priority Data

Sep. 10, 2001 (JP) ........................................ 2001-273110

(51) Int. Cl.[7] ................................................ G05F 1/10
(52) U.S. Cl. ........................................................ 327/536
(58) Field of Search ................................ 327/530, 534, 327/535, 536, 537, 538, 540, 543

(56) References Cited

U.S. PATENT DOCUMENTS

| | | | | |
|---|---|---|---|---|
| 5,736,880 A | * | 4/1998 | Bruccoleri et al. | 327/157 |
| 5,945,855 A | * | 8/1999 | Momtaz | 327/157 |
| 6,107,789 A | * | 8/2000 | Fryer et al. | 323/316 |
| 6,538,499 B1 | * | 3/2003 | Lu | 327/557 |

FOREIGN PATENT DOCUMENTS

| | | |
|---|---|---|
| EP | 0647032 A2 | 9/1994 |
| EP | 0994403 A1 | 4/2000 |
| JP | 2001-028540 | 1/2001 |

OTHER PUBLICATIONS

English Abstract of JP 2001–028540 as listed above.
Copy of European Patent Office Search Report dated Nov. 18, 2002 regarding a corresponding foreign application.

* cited by examiner

Primary Examiner—Jeffrey Zweizig
(74) Attorney, Agent, or Firm—Darryl G. Walker; Bradley T. Sako (57) ABSTRACT

A charge pump current compensating circuit (4) including feedback so that a difference between a charging current and a discharging current may be reduced is disclosed. Charge pump current compensating circuit (4) may include a current source leg (I11, N16, and N15), a first current mirror leg (P13, P14, N14, and N13), a second current mirror leg (P11, P12, N12, and N11), and a compensation circuit (5). Compensation circuit (5) may provide compensation to control insulated gate field effect transistors (IGFETs) (P12 and P13) so that a charging current and a discharging current may be essentially the same even when output impedances of IGFETs (P12 and N12) are different.

20 Claims, 5 Drawing Sheets

CHARGE PUMP CURRENT COMPENSATING CIRCUIT

TECHNICAL FIELD

The present invention relates generally to a charge pump current compensating circuit that may be used for a phase-locked loop (PLL) and/or a delay-locked loop (DLL) and more particularly to charge pump current compensating circuit that provides compensation so that charging current and discharge current may be essentially equal.

BACKGROUND OF THE INVENTION

A charge pump current compensating circuit can be used to compensate current supplied to a low-pass filter (LPF) of a phase locked loop (PLL) and/or a delay locked loop (DLL).

Figure 6:
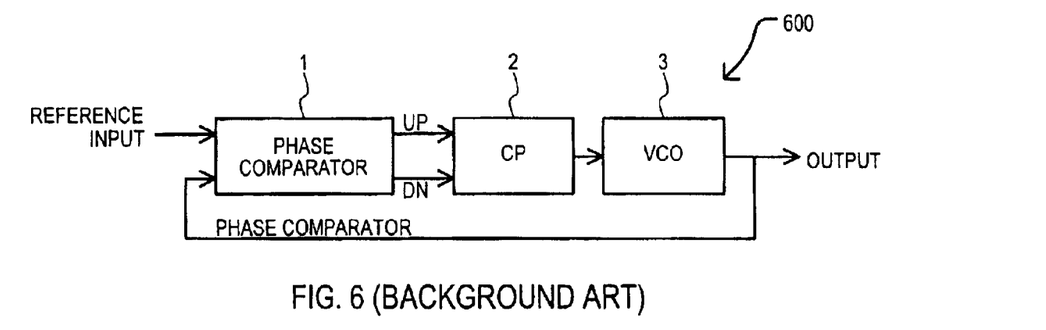
FIG. 6 is a block schematic diagram of a phase locked loop (PLL).

Referring to FIG. 6, a block schematic diagram of a phase locked loop (PLL) is set forth and given the general reference character 600.

PLL 600 includes a phase comparator 1, a conventional charge pump circuit (CP) 2, and a voltage controlled oscillator (VCO) 3.

Phase comparator 1 receives a reference input signal REFERENCE INPUT and an oscillating output signal OUTPUT and provides an up pulse UP and down pulse DN. Phase comparator 1 compares each phase of reference input signal REFERENCE INPUT and oscillating output signal OUTPUT. When reference input signal REFERENCE INPUT leads oscillating output signal OUTPUT, up pulse UP is provided. When reference input signal REFERENCE INPUT lags oscillating output signal OUTPUT, down pulse DN is provided. Conventional charge pump circuit 2 generates control current for charging or discharging a capacitor using the up pulse UP or the down pulse DN provided from phase comparator 1. Voltage controlled oscillator 3 provides oscillating output signal OUTPUT based upon a control voltage generated by conventional charge pump circuit 2. In this way, conventional charge pump circuit 2 in phase locked loop 600 controls charging current and discharge current for a capacitor of a low pass filter (LPF). By using a low pass filter (providing a sufficiently large capacitor value), the stability of an oscillating output signal OUTPUT is increased.

Figure 7:
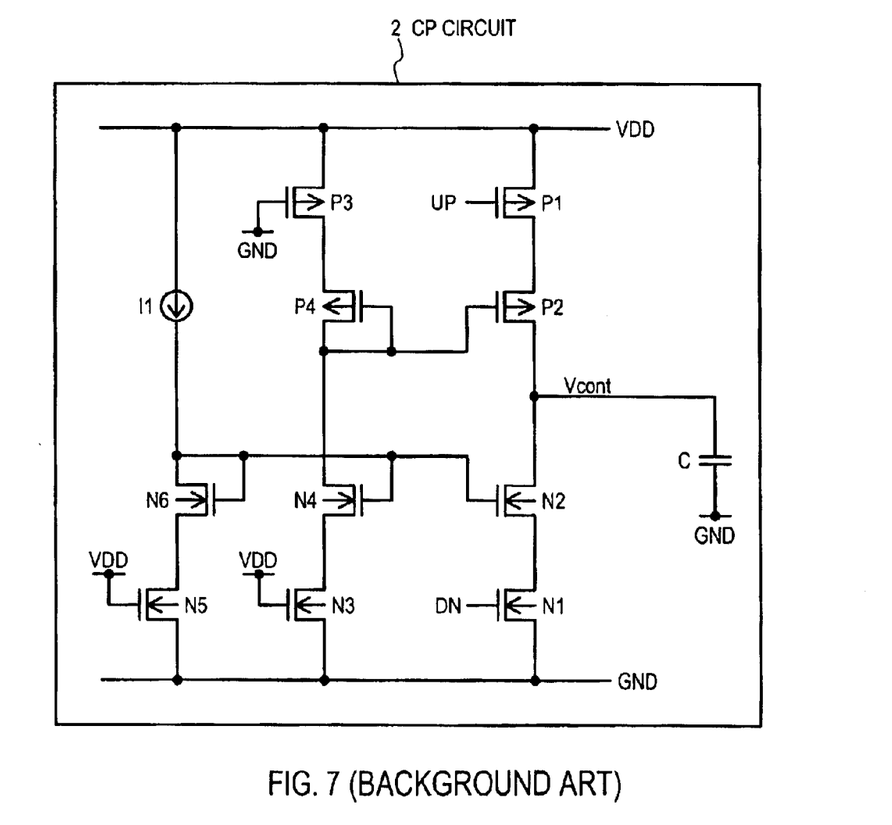
FIG. 7 is a circuit schematic diagram of conventional charge pump circuit.

Referring now to FIG. 7, a circuit schematic diagram of conventional charge pump circuit 2 is set forth.

Conventional charge pump circuit (CP circuit) 2 includes PMOS (p-type metal oxide semiconductor) transistors (P1 to P4), NMOS (n-type metal oxide semiconductor) transistors (N1 to N6), constant current source 11, and capacitor C.

Constant current source 11 has a current amplified by a current mirror that includes PMOS transistors (P2 and P4) for charging capacitor C and by a current mirror formed by NMOS transistors (N2 and N4) for discharging capacitor C. In this way, a desired constant current (for example, ten times current 11) is used to provide a predetermined voltage Vcont on capacitor C forming a low pass filter. Up pulse UP is provided to the gate of PMOS transistors P1 to control the charging current and down pulse DN is provided to the gate of NMOS transistor N1 to control the discharge current. Conventional charge pump circuit 2 varies the potential of voltage Vcont on capacitor C forming a low pass filter and thereby varying a frequency or delay time in phase locked loop 600.

Figure 8:
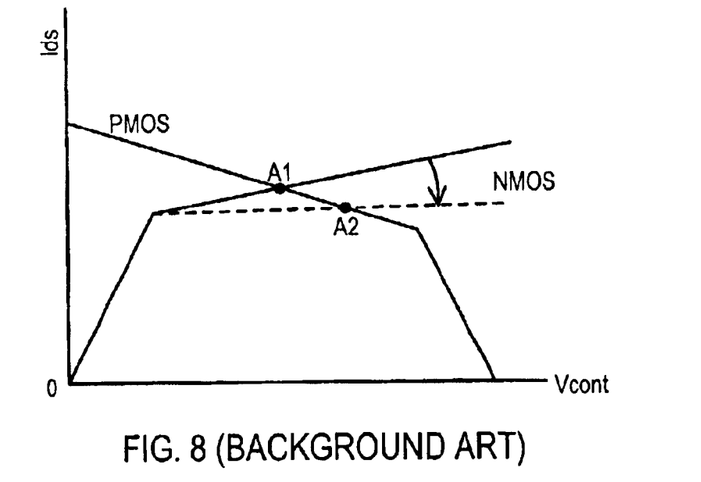
FIG. 8 is a graph illustrating transfer characteristics of a conventional charge pump circuit.

Referring to FIG. 8, a graph illustrating transfer characteristics of conventional charge pump circuit 2 is set forth.

As shown in FIG. 8, symmetrical voltage-current characteristics of PMOS transistor P2 and NMOS transistor N2 are illustrated with solid lines. A stable operating point of conventional charge pump circuit 2 gives a potential of voltage Vcont at point Al that can be supplied to voltage controlled oscillator VCO. However, when the output impedances of PMOS transistor P2 and NMOS transistor N2 varies due to process variations, the values (Ids) of charging current and discharge current become different.

For example, when the output impedance of NMOS N2 varies (from a characteristic illustrated as the solid line in FIG. 8 to a characteristic shown as a dashed line) due to process variations, voltage Vcont has a stable operating point at point A2. As a result, voltage Vcont can varies to point A2 through charge and discharge.

Figure 9:
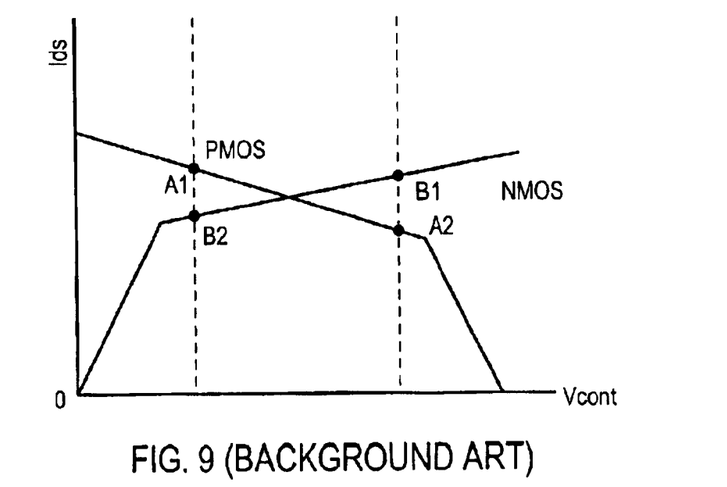
FIG. 9 is a graph illustrating transfer characteristics of a conventional charge pump circuit.

Referring to FIG. 9, a graph illustrating transfer characteristics of conventional charge pump circuit 2 is set forth. The transfer characteristics of FIG. 9 illustrate maximum and minimum points at which voltage Vcont and charging/discharge current are locked. FIG. 9 illustrates the maximum and minimum values at which NMOS and PMOS transistors (N2 and P2) are locked. When PMOS P2 is locked at point (A1), NMOS transistor N2 is locked at point (B2) or when PMOS P2 is locked at point (A2), NMOS transistor N2 is locked at point (B1) respectively. In this way, values of charging and discharging current (Ids) become different. As a result, a desired voltage Vcont cannot be acquired because of variations of points (B2) through discharge and variation of points (A1) through charging, or a desired voltage Vcont cannot be acquired because of variations of points (B1) through discharge and variation of points (A2) through charging. Also, the output impedances decrease as the gate length (L) of transistors forming charge pump is reduced. Thus, as transistors are reduced in size, process variations may cause greater effects and the difference between charging current and discharge current can become even greater.

A conventional charge pump circuit used for a PLL is described above. However, a conventional charge pump circuit can be similarly used for a DLL.

In a conventional charge pump circuit as described above, a charging current and a discharge current for a capacitor may be different due, for example, to process variations. Therefore, a conventional charge pump circuit may not keep an output potential (Vcont) in a desired range as illustrated in FIGS. 8 and 9. Due to this, the output potential (Vcont) may deviate from a desired range which may cause the performance of a PLL or DLL including the conventional charge pump circuit to deteriorate.

In view of the above discussion, it would be desirable to provide a charge pump current compensating circuit which may provide an output potential essentially constant or in a desired range.

SUMMARY OF THE INVENTION

According to the present embodiments, a charge pump current compensating circuit (4) including feedback so that a difference between a charging current and a discharging current may be reduced is disclosed. A charge pump current compensating circuit may include a current source leg, a first current mirror leg, a second current mirror leg, and a compensation circuit. A compensation circuit may provide compensation to control insulated gate field effect transistors (IGFETs) so that a charging current and a discharging current may be essentially the same even when output impedances of IGFETs are different.

According to one aspect of the embodiments, a charge pump compensating circuit may control a charge current for charging a capacitor and a discharge current for discharging a capacitor based on a phase comparator output. The charge pump current compensating circuit may include a compensation circuit coupled to receive a voltage output from the capacitor and provide compensation so that the charge current may be essentially the same value as the discharge current.

According to another aspect of the embodiments, the capacitor may be a capacitance of a low pass filter.

According to another aspect of the embodiments, the compensation circuit may prevent the voltage output from essentially varying.

According to another aspect of the embodiments, the compensation circuit may compensate for differences in a first output impedance of a p-type insulated gate field effect transistor (IGFET) and a second output impedance of a n-type IGFET so that the charge current may be essentially the same value as the discharge current.

According to another aspect of the embodiments, the charge pump current compensating circuit may include an essentially constant current circuit and a current mirror circuit. The essentially constant current circuit may provide a bias output. The current mirror circuit may receive the bias output and provide the charging current through a p-type IGFET having a control gate coupled to receive a compensation signal from the compensation circuit.

According to another aspect of the embodiments, the charge pump current compensating circuit may include an essentially constant current circuit and a current mirror circuit. The essentially constant current circuit may provide a bias output. The current mirror circuit may include a first current mirror leg and a second current mirror leg receiving the bias output. The first current mirror leg may provide the charging current and the discharge current at a first current mirror leg node. The compensation circuit may provide compensation by detecting a potential difference between the first current mirror leg node and a second current mirror leg node of the second current mirror leg.

According to another aspect of the embodiments, the charge pump current compensating circuit may be used in a phase locked loop or a delay locked loop.

According to another aspect of the embodiments, a charge pump current compensating circuit may include a current source leg, a first current mirror leg, a second current mirror leg, and a first compensation circuit. The current source leg may provide a bias potential. The first current mirror leg may receive the bias potential and provide a first current mirror leg voltage output. The second current mirror leg may receive the bias potential and provide charging current and discharge current for charging and discharging a capacitance at a second current mirror leg voltage output. The first compensation circuit may receive the first current mirror leg voltage output and the second current mirror leg voltage output and provide a first compensation potential to a control gate of a second current mirror leg insulated gate field effect transistor (IGFET) included in the second current mirror leg.

According to another aspect of the embodiments, the first compensation circuit may provide the first compensation potential to a first current mirror leg IGFET included in the first current mirror leg.

According to another aspect of the embodiments, the charge pump compensating circuit may include a third current mirror leg and a second compensation circuit. The third current mirror leg may receive the bias potential and provide a third current mirror leg voltage output. The second compensation circuit may receive the first current mirror leg voltage output and the third current mirror leg voltage output and provide a second compensation potential to a control gate of a third current mirror leg IGFET included in the third current mirror leg.

According to another aspect of the embodiments, the first compensation circuit may include a first sense amplifier and the second compensation circuit may include a second sense amplifier.

According to another aspect of the embodiments, the second current mirror leg IGFET is a p-type IGFET.

According to another aspect of the embodiments, the first current compensation circuit may provide compensation so that the charge current is essentially the same value as the discharge current.

According to another aspect of the embodiments, the charge pump current compensation circuit is used in a phase locked loop or a delay locked loop.

According to another aspect of the embodiments, a charge pump current compensating circuit may include a current source, a first amplifier, a first insulated gate field effect transistor (IGFET), a second IGFET, a third IGFET, a fourth IGFET, a fifth IGFET, a sixth IGFET, a seventh IGFET, and an eighth IGFET. The current source may be disposed between a first power source and a first bias node. The first amplifier may include a first amplifier input, a second amplifier input, and a first amplifier output. The first IGFET may be of a first conductivity type and may have a first IGFET source connected to the first power source, a first IGFET gate connected to a second power source, and a first IGFET drain coupled to the second IGFET source. The second IGFET may have the first conductivity type and may have a second IGFET drain connected to the first amplifier input and a fifth IGFET drain. The third IGFET may have the first conductivity type and may have a third IGFET source connected to the first power source, a third IGFET gate connected to receive a first input signal, and a third IGFET drain connected to a fourth IGFET source. The fourth IGFET may have the first conductivity type and may have a fourth IGFET gate connected to receive the first amplifier output and a fourth IGFET drain connected to the second amplifier input and a seventh IGFET drain. The fifth IGFET may have a second conductivity type and may have a fifth IGFET source connected to a sixth IGFET drain and a fifth IGFET gate connected to the first bias node. The sixth IGFET may have the second conductivity type and may have a sixth IGFET source connected to the second power source and a sixth IGFET gate connected to the first power source. The seventh IGFET may have the second conductivity type and may have a seventh IGFET source connected to an eighth IGFET drain and a seventh IGFET gate connected to the first bias node. The eighth IGFET may have the second conductivity type and may have an eighth IGFET gate connected to receive a second input signal and an eighth IGFET source connected to the second power source.

According to another aspect of the embodiments, the first conductivity type is p-type and the second conductivity type is n-type.

According to another aspect of the embodiments, the gate of the second IGFET is connected to receive the first amplifier output.

According to another aspect of the embodiments, the charge pump current compensating circuit may include a second amplifier, a ninth IGFET, a tenth IGFET, an eleventh IGFET, and a twelfth IGFET. The second amplifier may include a third amplifier input, a fourth amplifier input connected to the first amplifier input, and a second amplifier output. The ninth IGFET may have the first conductivity type and may have a ninth IGFET source connected to the first power source, a ninth IGFET gate connected to the second power source, and a ninth IGFET drain connected to a tenth IGFET source. The tenth IGFET may have the first conductivity type and may have a tenth IGFET gate connected to the second amplifier output and a tenth IGFET drain connected to the third amplifier input and an eleventh IGFET drain. The eleventh IGFET may have the second conductivity type and may have an eleventh IGFET source connected to a twelfth IGFET drain and an eleventh IGFET gate connected to the first bias node. The twelfth IGFET may have the second conductivity type and may have a twelfth IGFET source connected to the second power source and twelfth IGFET gate connected to the first power source.

According to another aspect of the embodiments, the first conductivity type may be p-type and the second conductivity type may be n-type.

According to another aspect of the embodiments, the fourth IGFET may provide a first current and the second IGFET may provide a second current and the first and second currents are essentially equal.

DETAILED DESCRIPTION OF THE EMBODIMENTS

Various embodiments of the present invention will now be described in detail with reference to a number of drawings.

Figure 1:
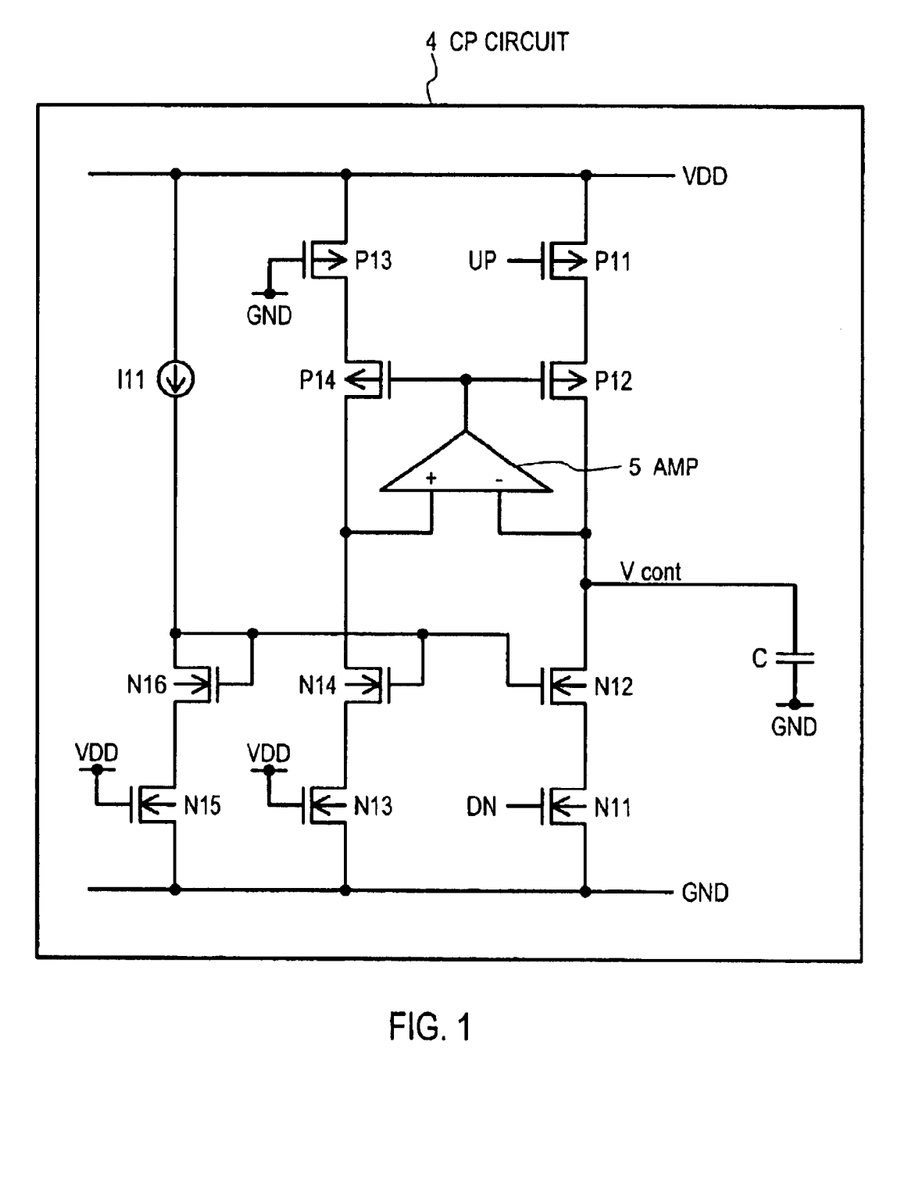
FIG. 1 is a circuit schematic diagram of a charge pump current compensating circuit according to an embodiment.

Referring now to FIG. 1, a circuit schematic diagram of a charge pump current compensating circuit (CP circuit) according to an embodiment is set forth and given the general reference character 4.

Charge pump current compensating circuit 4 may be used in a phase locked loop 600 as illustrated in FIG. 6 or a delay locked loop, as just two examples. Charge pump current compensating circuit 4 may include compensation by providing feedback so that charging current and discharge current can be essentially equal. In this way, differences in charging current and discharge current caused by, for example, discrepancies between respective output impedances of transistors may be reduced. Charge pump current compensating circuit 4 may be attained by adding a compensating circuit to a conventional type charge pump circuit.

Charge pump current compensating circuit 4 may include a constant current source I11, n-type insulated gate field effect transistors (IGFETs) (N11 to N16), p-type IGFETs (P11 to P14), capacitor C, and sense amplifier (AMP) 5.

Constant current source I11 may be connected between a first power source VDD and a common drain and gate of n-type IGFET N16. N-type IGFET N16 may have a source connected to a drain of n-type IGFET N15 and a gate and source commonly connected to gates of n-type IGFETs (N12 and N14). N-type IGFET N15 may have a gate connected to first power source VDD and a source connected to a second power source GND. In this way, n-type IGFET N15 may be normally turned on.

P-type IGFET P13 may have a source connected to first power source VDD, a gate connected to second power source GND, and a drain connected to a source of p-type IGFET P14. In this way, p-type IGFET P13 may be normally turned on. P-type IGFET P14 may have a gate connected to an output terminal of AMP 5 and a gate of p-type IGFET P12 and a drain connected to a drain of n-type IGFET N14 and a positive input terminal of AMP 5. N-type IGFET N14 may have a gate commonly connected to gates of n-type IGFETs (N12 and N16) and a drain of n-type IGFET N16 and a source connected to a drain of n-type IGFET N13. N-type IGFET N13 may have a gate connected to first power source VDD and a source connected to second power source GND. In this way, n-type IGFET N13 may be normally turned on.

P-type IGFET P11 may have a source connected to first power source VDD, a gate connected to receive up pulse UP, and a drain connected to a source of p-type IGFET P12. P-type IGFET P12 may have a gate connected to a gate of p-type IGFET P14 and an output terminal of AMP 5 and a drain connected to a drain of n-type IGFET N12, a negative input terminal of AMP 5, and a first terminal of capacitor C. N-type IGFET N12 may have a drain connected to a first terminal of capacitor C and a gate connected to gates of n-type IGFETs (N14 and N16) and a drain of n-type IGFET N16 and a source connected to a drain of n-type IGFET N11. N-type IGFET N11 may have a gate connected to receive down pulse DN and a source connected to second power source GND. Capacitor C may have a second terminal connected to second power source GND.

Current essentially equal to constant current source I11 may flow through n-type IGFET N16. N-type IGFET N14 may form a current mirror, such that current flowing through n-type IGFET N14 may be proportional (based on transistor sizes) to constant current source I11. Because of a series connection, essentially the same current value may flow through p-type IGFET P14 as n-type IGFET N14.

P-type IGFET P12 may form a current mirror with respect to p-type IGFET P14. In this way, when up pulse UP turns on p-type IGFET P11, current flowing through p-type IGFET P14 may be essentially mirrored in p-type IGFET P12. In a similar way, n-type IGFET N12 may form a current mirror configuration with n-type IGFET N14 such that when down pulse DN turns on n-type IGFET N11, current flowing through n-type IGFET N14 may be essentially mirrored in n-type IGFET N12.

The current mirror formed by p-type IGFETs (P14 and P12) may be conceptualized as a current mirror for charging capacitor C with a charging current. The current mirror formed by n-type IGFETs (N14 and N12) may be conceptualized as a current mirror for discharging capacitor C with a discharge current. Capacitor C may form a low pass filter, such that high frequency noise, for example, may be filtered out.

Charge pump compensating circuit 4 may include AMP 5 to reduce a difference between a charging current and a discharge current by detecting a difference in voltage between an output node (Vcont) and a common drain connection between p-type IGFET P14 and n-type IGFET N14. AMP 5 may provide a feedback potential to gates of p-type IGFETs (P12 and P14) in accordance with a detected voltage difference. In this way, the drain voltages of p-type IGFETs (P12 and P14) may be essentially kept the same, and a first current leg (P13, P14, N14, and N13) may be similarly biased to the mirror current leg (P11, P12, N12, and N11) so that differences in charging and discharge current may be reduced.

Next, the operation of charge pump compensating circuit 4 will be explained for a case where output potential Vcont is relatively high and a case where output potential Vcont is relatively low.

First, when output potential Vcont is high, current flowing through n-type IGFET N12 may try to increase and current flowing through p-type IGFET P12 may try to decrease. However, feedback through AMP 5 may make drains of n-type IGFETs (N12 and N14) essentially the same by lowering a gate potential of p-type IGFETs (P12 and P14). By doing so, current flowing through p-type IGFET P14 may be made to be essentially the same as current flowing through n-type IGFET N14. In a similar way, current flowing through p-type IGFET P12 may be made to be essentially the same as current flowing through n-type IGFET N12.

Alternatively, when output potential Vcont is low, current flowing through n-type IGFET N12 may try to decrease and current flowing through p-type IGFET P12 may try to increase. However, feedback through AMP 5 may make drains of n-type IGFETs (N12 and N14) essentially the same by raising a gate potential of p-type IGFETs (P12 and P14). By doing so, current flowing through p-type IGFET P14 may be made to be essentially the same as current flowing through n-type IGFET N14. In a similar way, current flowing through p-type IGFET P12 may be made to be essentially the same as current flowing through n-type IGFET N12.

Also, when the output impedance of p-type IGFET P12 and n-type IGFET N12 becomes different than a designed value due to process variations, for example. A potential difference and/or current flow difference that may occur may be compensated for by using feedback with AMP 5 to control a gate potential of p-type IGFETs (P12 and P14) in a similar manner as described above.

Figure 2A:
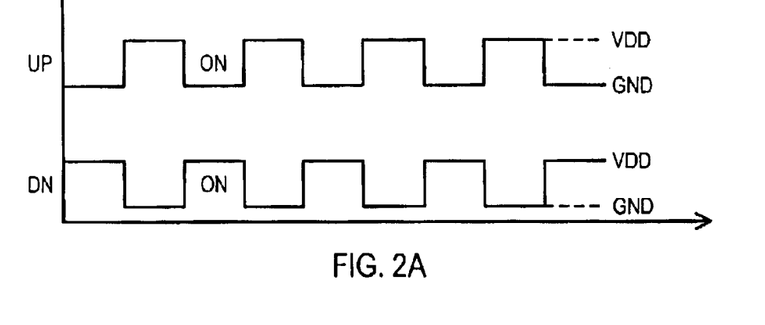
FIG. 2A are timing diagrams of an up pulse and a down pulse according to an embodiment.
Figure 2B:
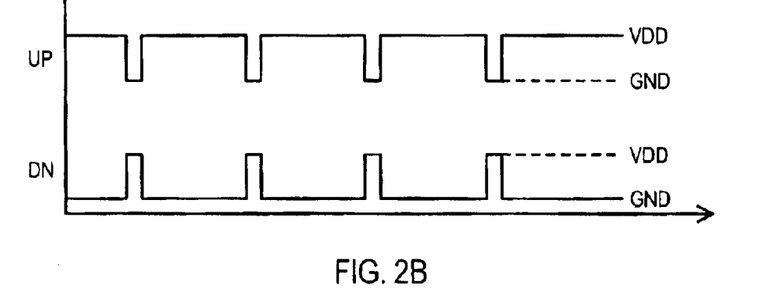
FIG. 2B are timing diagrams of an up pulse and a down pulse according to an embodiment.

Referring now to FIGS. 2A and 2B, timing diagrams of up pulse UP and down pulse DN according to an embodiment are set forth.

FIG. 2A is a timing diagram of up pulse UP and down pulse DN where a turn on period of p-type IGFET P11 and n-type IGFET Nil is substantially equal to the turn off period. FIG. 2A illustrates a timing that may be used for a phase comparator of a delay locked loop, for example. FIG. 2B is a timing diagram of up pulse UP and down pulse DN where a turn on period of p-type IGFET P11 and n-type IGFET N11 is much less than the turn off period.

When up pulse UP is at a high level (VDD), p-type IGFET P11 may be turned off and when up pulse UP is at a low level (GND), p-type IGFET P11 may be turned on. When down pulse DN is at a low level (GND), n-type IGFET N11 may be turned off and when down pulse DN is at a high level (VDD), n-type IGFET N11 may be turned on.

Figure 3:
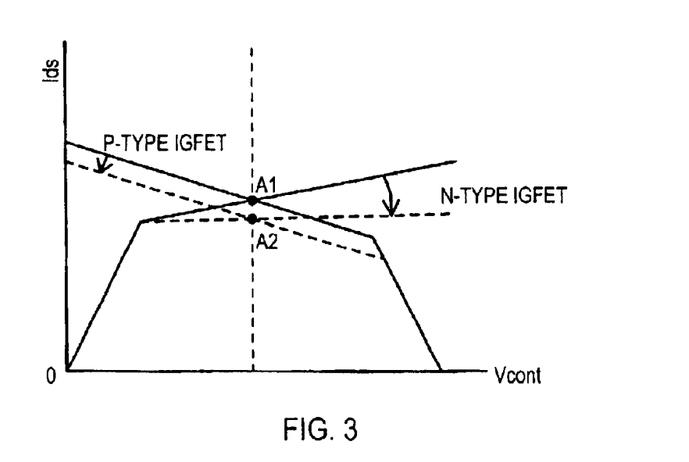
FIG. 3 is a graph illustrating transfer characteristics of charge pump compensating circuit according to an embodiment.

Referring now to FIG. 3, a graph illustrating transfer characteristics of charge pump compensating circuit 4 is set forth.

As shown in FIG. 3, voltage-current characteristics of p-type IGFET P12 and n-type IGFET N12 are symmetrically illustrated with solid lines. A stable operating point of conventional charge pump circuit 2 gives a potential of voltage Vcont at point A1 that can be supplied to a voltage controlled oscillator (such as VCO 3 in FIG. 6). As described above, in charge pump compensating circuit 4, the values (Ids) of charging current and discharge current may be substantially equal even when the output impedances of p-type IGFET P12 and n-type IGFET N12 vary due to process variations. In this way, output voltage Vcont may be kept essentially constant.

For example, even if an output impedance of n-type IGFET N12 varies from a desired characteristic (solid line) to another characteristic (illustrated with a dashed line) due to process variations or the like, by providing feedback to a gate of p-type IGFET P12 a characteristic as illustrated in a dotted line may be provided. In this way, output voltage may be locked at a point A2 such that charging and discharge currents (Ids) may have essentially the same lower value and output voltage Vcont may remain the same.

Figure 4:
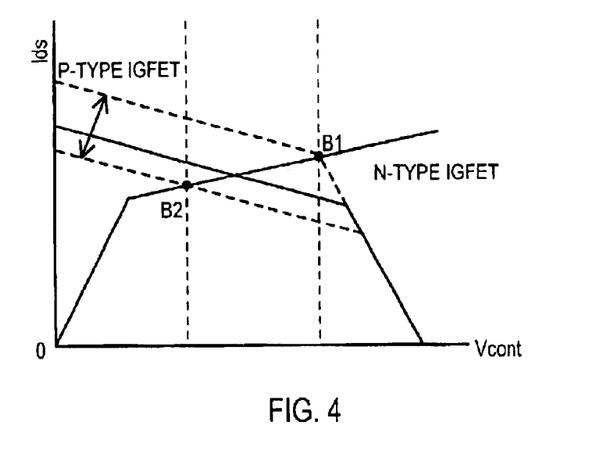
FIG. 4 is a graph illustrating transfer characteristics of a charge pump compensating circuit showing maximum value and minimum value of points at which an output voltage and charging/discharge currents (Ids) may be locked according to an embodiment.

Referring now to FIG. 4, a graph illustrating transfer characteristics of charge pump compensating circuit 4 showing maximum value and minimum value of points at which output voltage Vcont and charging/discharge currents (Ids) may be locked is set forth.

When output voltage Vcont is locked at a point B2 (a minimum voltage) on a characteristic line of n-type IGFET N12 as illustrated in FIG. 4, feedback provided by AMP 5 to a gate of p-type IGFETs (P12 and P14) may provide characteristics for p-type IGFET P12 as illustrated in a dashed line that pass through point B2. In this way, output voltage Vcont may be stably provided and charging and discharge currents may be essentially the same.

When output voltage Vcont is locked at a point BI (a maximum voltage) on a characteristic line of n-type IGFET N12 as illustrated in FIG. 4, feedback provided by AMP to a gate of p-type IGFETs (P12 and P14) may provide characteristics for p-type IGFET P12 as illustrated in a dashed line that pass through point B1. In this way, output voltage Vcont may be stably provided and charging and discharge currents may be essentially the same.

In this way, charging current and discharge current may be substantially equal by using feedback to modify an output impedance of p-type IGFET P12 even for values of output voltage Vcont over a relatively wide range.

Current in p-type IGFET P12 and n-type IGFET N12 may be kept essentially equal independent of a value of output potential Vcont by providing feedback so that differences in charging current and discharge current caused by, for example, discrepancies between respective output impedances of transistors may be reduced. A sense amplifier 5 may sense a difference in potentials at respective nodes in current legs and provide feedback to gates of p-type IGFETs (P12 and P14) to provide current legs that may be similarly biased, so that a difference charging current and discharge current may be essentially zero. Even if p-type IGFETs (P12 and P14) and n-type IGFETs (N12 and N14) are operated in a linear region instead of a saturation region such that current may greatly vary, the charging and discharge current may be essentially equal due to the feedback control of the gate voltage of p-type IGFETs (P12 and P14) by AMP 5.

Figure 5:
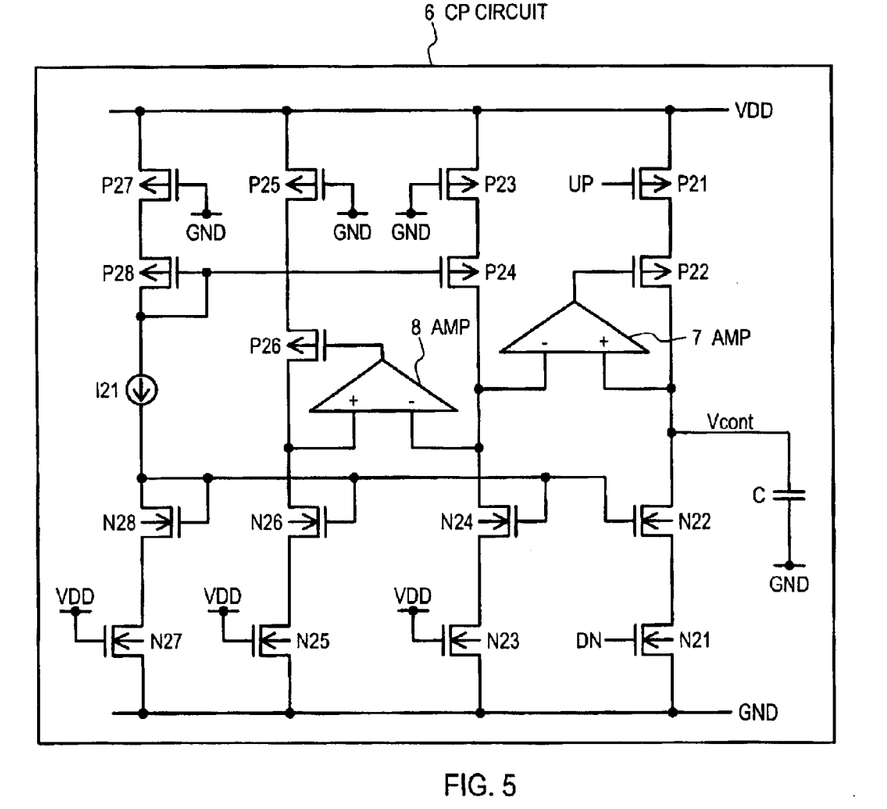
FIG. 5 is a circuit schematic diagram of a charge pump current compensating circuit according to an embodiment.

Referring now to FIG. 5, a circuit schematic diagram of a charge pump current compensating circuit (CP circuit) according to an embodiment is set forth and given the general reference character 6.

Charge pump current compensating circuit 6 may differ from charge pump current compensating circuit 4 in that an additional current mirror leg may be included with an additional sense amplifier.

Charge pump current compensating circuit 6 may be used in a phase locked 600 as illustrated in FIG. 6 or a delay locked loop, as just too examples.

Charge pump current compensating circuit 6 may include p-type IGFETs (P21 to P28), n-type IGFETs (N21 to N28), constant current source 121, and sense amplifiers AMPs (7 and 8).

P-type IGFET P27 may have a source connected to first power source VDD, a gate connected to a second power source GND, and a drain connected to source and gate of p-type IGFET P28. P-type IGFET P28 may have a drain and gate connected to a first terminal of constant current source 121 and a gate of p-type IGFET P24. Constant current source 121 may have a second terminal connected to a common connection between a drain and gate of n-type IGFET N28 and gates of n-type IGFETs (N22, N24, and N26). N-type IGFET N28 may have a source connected to a drain of n-type IGFET N27. N-type IGFET N27 may have a gate connected to first power source VDD and a source connected to second power source GND.

P-type IGFET P25 may have a source connected to first power source VDD, a gate connected to a second power source GND, and a drain connected to a source of p-type IGFET P26. P-type IGFET P26 may have a gate connected to receive an output of AMP 8 and a drain commonly connected to a drain of n-type IGFET N26 and a positive input terminal of AMP 8. N-type IGET N26 may have a source connected to a drain of n-type IGFET N25. N-type IGFET N25 may have a gate connected to first power source VDD and a source connected to second power source GND.

P-type IGFET P23 may have a source connected to first power source VDD, a gate connected to second power source GND, and a drain connected to a source of p-type IGFET P24. P-type IGFET P24 may have a drain connected to a drain of n-type IGFET N24 and negative input terminals of AMPs (7 and 8). N-type IGFET N24 may have a source connected to a drain of n-type IGFET N23. N-type IGFET N23 may have a gate connected to first power source VDD and a source connected to second power source GND.

P-type IGFET P21 may have a source connected to first power source VDD, a gate connected to receive up pulse UP, and a drain connected to a source of p-type IGFET P22. P-type IGFET P22 may have a gate connected to an output terminal of AMP 7 and a drain connected to a drain of n-type IGFET N22, a positive input of AMP 7, and a first terminal of capacitor C. N-type IGFET N22 may have a source connected to a drain of n-type IGFET N21. N-type IGFET N21 may have a gate connected to receive down pulse DN and a source connected to receive second power source GND. Capacitor C may have a second terminal connected to second power source GND.

By having gates connected to second power source GND, p-type IGFETs (P23, P25, and P27) may be normally turned on. By having gates connected to first power source VDD, n-type IGFETs (N23, N25, and N27) may be normally turned on.

P-type IGFETs (P27 and P28), constant current source 121, and n-type IGFETs (N27 and N28) may form a constant current source circuit. P-type IGFETs (P21 to P26) and n-type IGFETs (N21 and N26) may form a current mirror circuit with respect to constant current source circuit. P-type IGFETs (P21 and P22) may provide a charging current for charging capacitor C. N-type IGFETs (N21 and N22) may provide a discharge current for discharging capacitor C. AMPs (7 and 8) may form feedback circuits for reducing or essentially eliminating a difference between the charging current and discharge current.

In this way, current in p-type IGFET P22 and n-type IGFET N22 may be kept essentially equal essentially independent of output potential Vcont. By doing so, even if a difference in respective output impedances of p-type IGFET P22 and n-type IGFET N22 occurs, charging current and discharge current may be essentially equal and output voltage Vcont may be kept in a desired range. Even if p-type IGFETs (P22 and P26) and n-type IGFETs (N22 and N26) are operated in a linear region instead of a saturation region such that current may greatly vary, the charging and discharge current may be essentially equal due to the feedback control of the gate voltage of p-type IGFETs (P22 and P26) by AMPs (7 and 8).

It is understood that the embodiments described above are exemplary and the present invention should not be limited to those embodiments. Specific structures should not be limited to the described embodiments.

For example, in the embodiments, feedback may be used to adjust the charging current of a p-type IGFET. However, similar effects may be obtained by using feedback to adjust the discharge current of a n-type IGFET, as just one example.

N-type IGFETs and p-type IGFETs may be metal oxide semiconductor field effect transistors (MOSFETs), as just one example.

First power source VDD may have a higher potential than second power source GND.

As described above, a charge pump current compensating circuit according to the embodiments may have an effect of keeping an output potential (Vcont) essentially constant or in a desired range by reducing or essentially eliminating a difference between charging current and discharge current. A difference between charging current and discharging current may be essentially be eliminated by using a sense amplifier to provide feedback to a gate, so that differences caused by, for example, differing output impedances of transistors may be compensated.

Even if IGFETs are operated in a linear region instead of a saturation region such that current may greatly vary, the charging and discharge current may be essentially equal due to the feedback control.

A current source I11 in a first current leg (I11, N16, and N15) may provide a reference current for current legs (P13-P14-N14-N13 and P11-P12-N12-N11) in a current mirror circuit. Current in current legs in the current mirror circuit may be proportional to the reference current in accordance with size ratios of IGFETs, which may provide a current mirror function.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A charge pump current compensating circuit that controls a charge current for charging a capacitor and a discharge current for discharging the capacitor based on a phase comparator output, comprising:
   a compensation circuit coupled to receive a voltage output from the capacitor and providing compensation so that the charge current is essentially the same value as the discharge current.

2. The charge pump current compensating circuit according to claim 1, wherein:
   the capacitor is capacitance of a low pass filter.

3. The charge pump current compensating circuit according to claim 1, wherein:
   the compensation circuit prevents the voltage output from essentially varying.

4. The charge pump current compensating circuit according to claim 1, further including:
   the compensation circuit compensates for differences in a first output impedance of a p-type insulated gate field effect transistor (IGFET) and a second output impedance of an n-type IGFET so that the charge current is essentially the same value as the discharge current.

5. The charge pump current compensating circuit according to claim 1, further including:
   an essentially constant current circuit providing a bias output; and
   a current mirror circuit coupled to receive the bias output and providing the charging current through a p-type IGFET having a control gate coupled to receive a compensation control signal from the compensation circuit.

6. The charge pump current compensating circuit according to claim 1, further includes:
   an essentially constant current circuit providing a bias output; and
   a current mirror circuit including a first current mirror leg and a second current mirror leg coupled to receive the bias output wherein
      the first current mirror leg providing the charging current and the discharge current at a first current mirror leg node and the compensation circuit provides compensation by detecting a potential difference between the first current mirror leg node and a second current mirror leg node of the second current mirror leg.

7. The charge pump current compensating circuit according to claim 1, wherein:
   the charge pump current compensating circuit forms part of a circuit selected from the group consisting of a phase locked loop and delay locked loop.

8. A charge pump current compensating circuit, comprising:
   a current source leg providing a bias potential;
   a first current mirror leg coupled to receive the bias potential and providing a first current mirror leg voltage output;
   a second current mirror leg coupled to receive the bias potential and providing charging current and discharge current for charging and discharging a capacitance at a second current mirror leg voltage output; and
   a first compensation circuit coupled to receive the first current mirror leg voltage output and the second current mirror leg voltage output and providing a first compensation potential to a control gate of a second current mirror leg insulated gate field effect transistor (IGFET) included in the second current mirror leg.

9. The charge pump current compensating circuit according to claim 8, further including:
   the first compensation circuit providing the first compensation potential to a first current mirror leg IGFET included in the first current mirror leg.

10. The charge pump current compensating circuit according to claim 8, further including:
    a third current mirror leg coupled to receive the bias potential and providing a third current mirror leg voltage output; and
    a second compensation circuit coupled to receive the first current mirror leg voltage output and the third current mirror leg voltage output and providing a second compensation potential to a control gate of a third current mirror leg IGFET included in the third current mirror leg.

11. The charge pump current compensating circuit according to claim 10, wherein:
    the first compensation circuit includes a first sense amplifier and the second compensation circuit includes a second sense amplifier.

12. The charge pump current compensating circuit according to claim 8, wherein:
    the second current mirror leg IGFET is a p-type IGFET.

13. The charge pump current compensating circuit according to claim 8, wherein:
    the first current compensation circuit provides compensation so that the charge current has essentially the same value as the discharge current.

14. The charge pump current compensating circuit according to claim 8, wherein:
    the charge pump current compensating circuit forms part of a circuit selected from the group consisting of a phase locked loop and delay locked loop.

15. A charge pump current compensating circuit, comprising:
    a current source coupled between a first power source and a first bias node;
    a first amplifier having a first amplifier input, a second amplifier input and a first amplifier output;
    a first insulated gate field effect transistor (IGFET) of the first conductivity type having a first IGFET source coupled to the first power source, a first IGFET gate coupled to a second power source, and a first IGFET drain coupled to a second IGFET source;
    a second IGFET of the first conductivity type having the second IGFET source, a second IGFET gate, and a second IGFET drain coupled to the first amplifier input and a fifth IGFET drain;
    a third IGFET of the first conductivity type having a third IGFET source coupled to the first power source, a third IGFET gate coupled to receive a first input signal, and a third IGFET drain coupled to a fourth IGFET source;
    a fourth IGFET of the first conductivity type having the fourth IGFET source, a fourth IGFET gate coupled to receive the first amplifier output, and a fourth IGFET drain coupled to the second amplifier input and a seventh IGFET drain;
    a fifth IGFET of a second conductivity type having a fifth IGFET source coupled to a sixth IGFET drain, a fifth IGFET gate coupled to the first bias node, and the fifth IGFET drain;
    a sixth IGFET of the second conductivity type having a sixth IGFET source coupled to the second power source, a sixth IGFET gate coupled to the first power source, and the sixth IGFET drain;

a seventh IGFET of the second conductivity type having a seventh IGFET source coupled to an eighth IGFET drain, a seventh IGFET gate coupled to the first bias node, and the seventh IGFET drain;

an eighth IGFET of the second conductivity type having an eighth IGFET source coupled to the second power source, an eighth IGFET gate coupled to receive a second input signal, and the eighth IGFET drain.

16. The charge pump current compensating circuit according to claim 15, wherein:

the first conductivity type is p-type and the second conductivity type is n-type.

17. The charge pump current compensating circuit according to claim 15, wherein:

the gate of the second IGFET is coupled to receive the first amplifier output.

18. The charge pump current compensating circuit according to claim 15, further including:

a second amplifier having a third amplifier input, a fourth amplifier input coupled to the first amplifier input, and a second amplifier output;

a ninth IGFET of the first conductivity type having a ninth IGFET source coupled to the first power source, a ninth IGFET gate coupled to the second power source, and a ninth IGFET drain coupled to a tenth IGFET source;

a tenth IGFET of the first conductivity type having the tenth IGFET source, a tenth IGFET gate coupled to the second amplifier output, and a tenth IGFET drain coupled to the third amplifier input and an eleventh IGFET drain;

an eleventh IGFET of the second conductivity type having an eleventh IGFET source coupled to a twelfth IGFET drain, an eleventh IGFET gate coupled to the first bias node, and the eleventh IGFET drain;

a twelfth IGFET of the second conductivity type having a twelfth IGFET source coupled to the second power source, a twelfth IGFET gate coupled to the first power source, and the twelfth IGFET drain.

19. The charge pump current compensating circuit according to claim 18, wherein:

the first conductivity type is p-type and the second conductivity type is n-type.

20. The charge pump current compensating circuit according to claim 15, wherein:

the fourth IGFET provides a first current and the second IGFET provides a second current and the first and second currents are essentially equal.

* * * * *